United States Patent
Berg

(10) Patent No.: US 7,019,566 B2
(45) Date of Patent: Mar. 28, 2006

(54) BI-POLAR PNP CHOPPER

(75) Inventor: Bengt Berg, Solna (SE)

(73) Assignee: Infineon Technologies AG, Munich (DE)

( * ) Notice: Subject to any disclaimer, the term of this patent is extended or adjusted under 35 U.S.C. 154(b) by 66 days.

(21) Appl. No.: 10/882,900

(22) Filed: Jun. 30, 2004

(65) Prior Publication Data

US 2005/0001657 A1 Jan. 6, 2005

(30) Foreign Application Priority Data

Jun. 30, 2003 (SE) .................................... 0301927

(51) Int. Cl.
*H03K 17/00* (2006.01)

(52) U.S. Cl. .......................................... 327/124; 330/9

(58) Field of Classification Search ................ 327/100, 327/124; 330/9

See application file for complete search history.

(56) References Cited

U.S. PATENT DOCUMENTS

| 5,486,788 A | * | 1/1996 | Schlager et al. | ................ 330/9 |
| 5,959,498 A | | 9/1999 | Sauer | ............................ 330/9 |
| 6,307,430 B1 | | 10/2001 | Thomsen et al. | ............... 330/9 |

\* cited by examiner

*Primary Examiner*—Kenneth B. Wells
(74) *Attorney, Agent, or Firm*—Baker Botts L.L.P.

(57) ABSTRACT

A switch comprises an input with two input lines and an input stage comprising four current controlled PNP-transistors and four resistors, and an output comprising two output lines, and arranged to receive a constant voltage on the input and on the output produce a variable voltage. The switch further comprises four constant current sources which are connected to the bases of the first, second, third and fourth transistor, respectively so that the transistors are saturated. The switch further comprises four alternating current sources which are connected to the emitters of the first, second, third and fourth transistor, respectively, so that the transistors alternately are conducting current from emitter to collector and from collector to emitter. Furthermore, an amplifier, a comparator and a method for tuning the working point of a power transistor can be provided using such a switch.

13 Claims, 6 Drawing Sheets

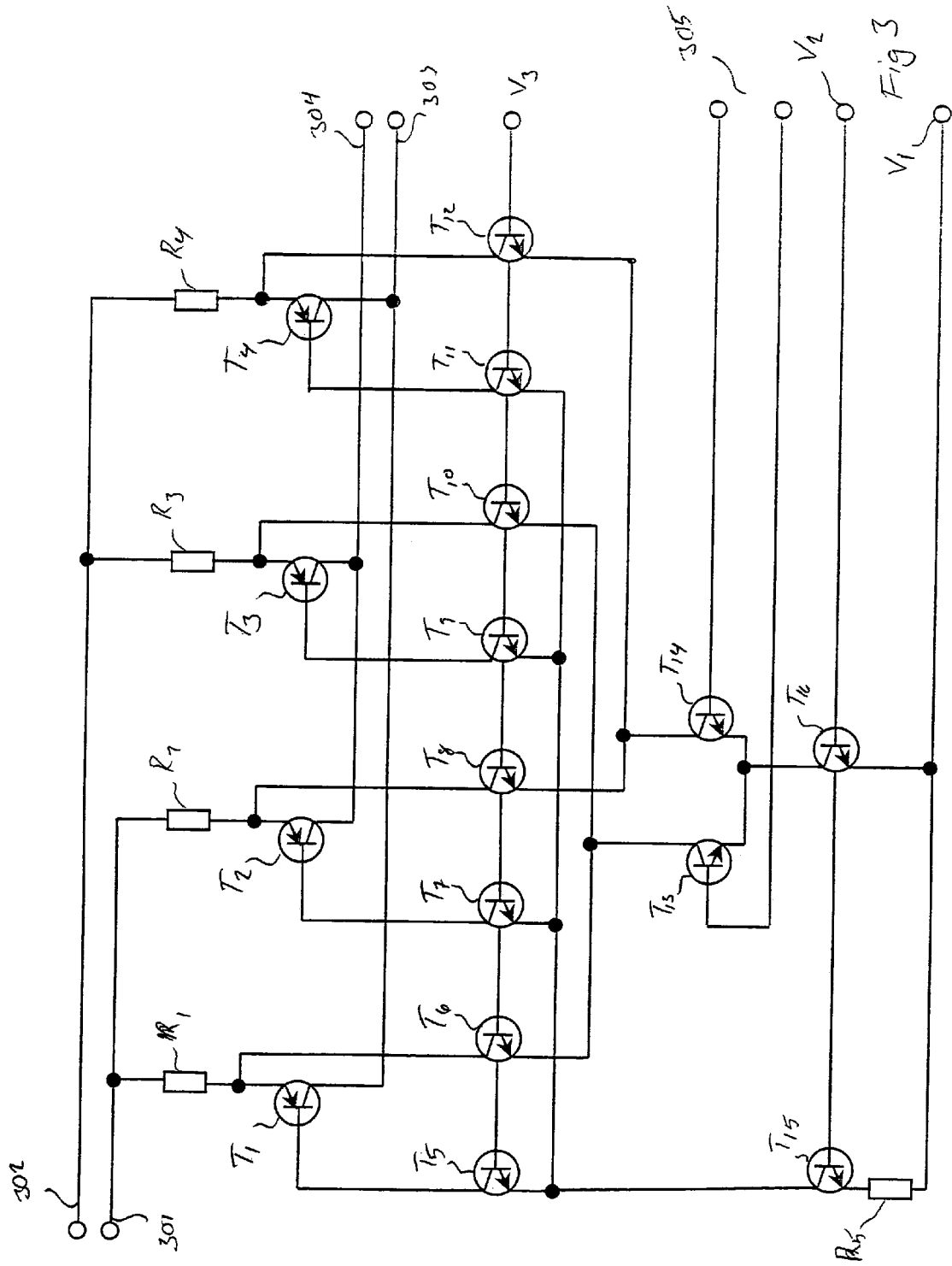

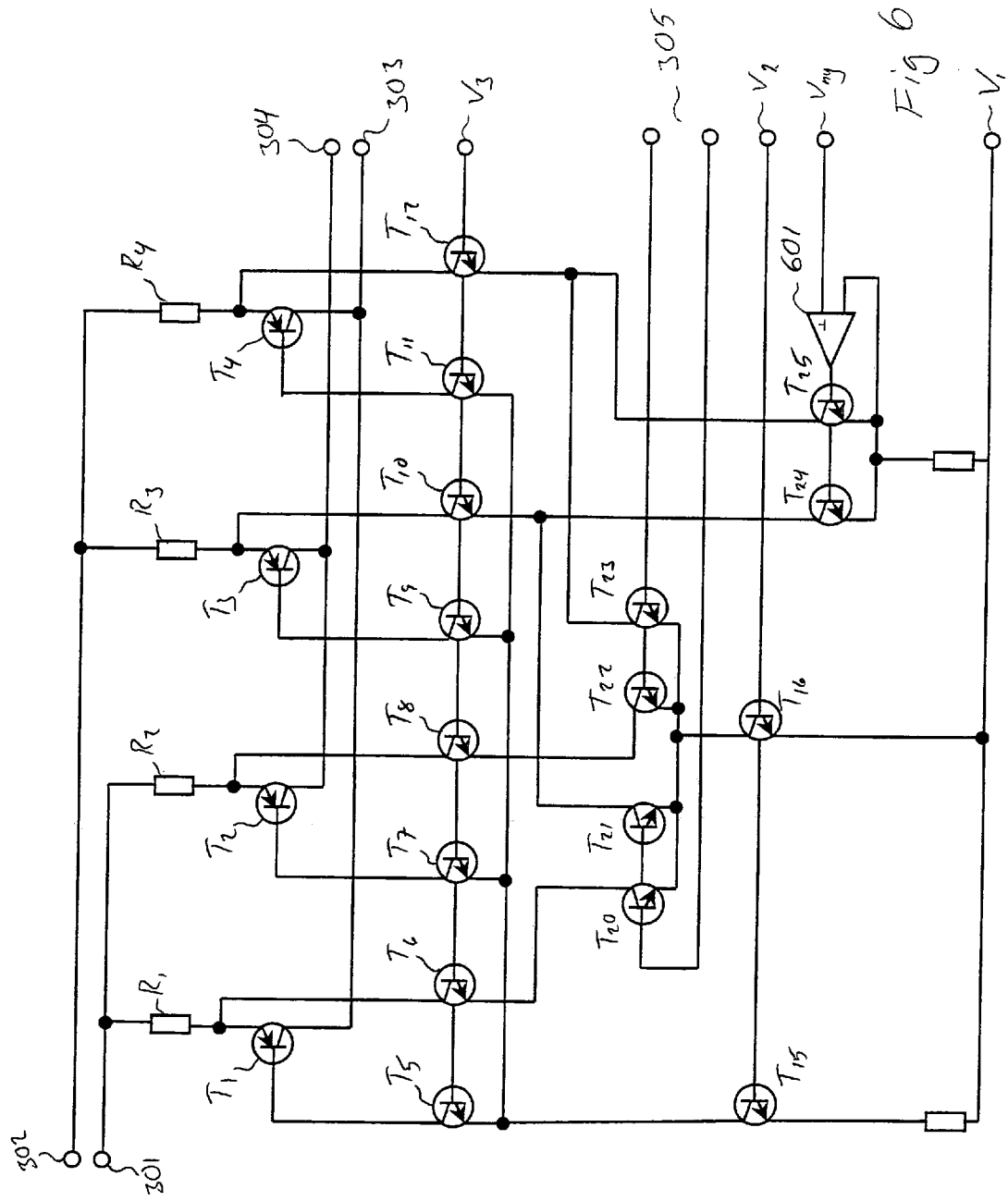

BI-POLAR PNP CHOPPER

PRIORITY

This application claims priority to Swedish application no. 0301927-0 filed Jun. 30, 2003.

TECHNICAL FIELD OF THE INVENTION

The present invention relates to a switch, a chopper stabilised amplifier, a comparator and a method for tuning a working point for a power transistor. More specifically the present invention is intended for tuning a working point for a power transistor in an integrated circuit built by bi-polar components.

BACKGROUND OF THE INVENTION

In large radio transmitters, several cooperating high frequency power transistors, are utilised, e.g. LDMOS. A matching procedure is required to make these power transistors work optimally by dividing the transmitted power equal between the transistors and to make the transmitter optimally linear. The matching procedure should compensate for any spread between the different transistors. A part of this matching procedure is to tune, and set, the same working point for the cooperating high frequency power transistors.

It is beneficial to automate this matching procedure. This can be done by a circuit, which measures the drain current at the MOS-transistor, or collector current if the transistor is a bi-polar transistor, while changing the gate voltage at the MOS-transistor, or base voltage in the case of a bi-polar transistor until a suitable drain current, or collector current, is achieved.

In the following description only the terms, drain and gate will be used. It is however clear to the man skilled in the art that a bipolar transistor may instead be used and in which case the term drain should be substituted with the term collector and the term gate should be substituted with the term base.

The drain current is normally measured with a resistor serially connected to the drain connection. Occasionally a common resistor is used for several transistors, in which case the transistors are turned on by one, while the others are turned off.

The most common praxis is that no mechanical relays should be present to disconnect the transistor after the matching procedure, which means that the resistor will still be present during the operation of the power transistors, i.e. during transmission by the transmitter. This resistor will then steal power from the transmission and it is thus important to have a resistor with very low resistance. Common values are ranging from 100 mΩ to only a few mΩ.

The voltage drop over this resistor, caused by the power idle current of the transistors, should then be measured with enough accuracy. That is, a voltage drop of only few millivolts should be measured with enough accuracy, requiring a measurement precision of parts of a millivolt.

In addition thereto the resistor, over which, this small voltage drop should be measured, is connected to the feeding voltage, maybe as high as 30 Volt.

A common differential amplifier stage in an integrated circuit has an offset voltage of a few millivolts and is thus not accurate enough to be used for this type of voltage measurement. A circuit could of course be designed, but it would require trimming to achieve the required accuracy. This is a drawback since one would prefer circuits, which easily can be mass-produced and which do not risk problems regarding aging and temperature dependence.

A chopper-stabilised amplifier could, however, fulfill the requirements.

If a monolith solution is required, i.e. a single integrated circuit, and the output of the matching function should be on the low side of the feeding voltage, a relatively high-voltage process needs to be employed, that is a process allowing designs having high feeding voltage. This could for instance be a bi-polar process using PNP-transistors. With PNP-transistors is however a number of problems associated.

The problems that need to be overcome are, amongst others, that the PNP-transistors are non-linear, have a saturation voltage, consume bas current, and works equally well in reverse mode i.e. with emitter as collector and vice verse. Further problems are that the transistors generate substrate current, and have a high base-collector capacitance.

Implemented as high-voltage bi-polar lateral PNP-transistors, the transistors are limited in working frequency. This is a problem since the subsequent filter in the chopper-stabilised amplifier would have to have a low cut-frequency, which in turn makes the complete system slow and that the subsequent filter components take a relatively large area on the chip.

These problems have, in the prior art, limited the use of PNP-transistors for a chopper function.

SUMMARY OF THE INVENTION

It is a main object of the present invention to provide such apparatus and method that at least alleviate the above problems.

It is in this respect a particular object of the invention to provide such apparatus and method that can measure a small voltage drop over a low resistance resistor in a high-voltage bi-polar process using PNP-transistors in a switch, the switch being used in a chopper-stabilised amplifier.

It is still a further object of the invention to provide such apparatus and method that uses a comparator, having a chopper-stabilised amplifier with a switch using bi-polar PNP-transistors in a high-voltage process, for comparing a voltage drop over a small resistance with a reference voltage.

It is still a further object of the invention to provide such apparatus and method that can automatically tune the working point of a power transistor by comparing the voltage drop over a resistor having a small resistance connected to the drain of the power transistor with a reference voltage and changing the gate voltage to match the measured voltage to the reference voltage.

These objects among others are, according to a first aspect of the present invention, attained by a switch having an input with a first and a second input line and an input stage comprising first, second, third and fourth current controlled PNP-transistors and first, second, third and fourth resistors, and arranged to receive a constant voltage on the input. The switch further comprises an output having a first and a second output line, and are arranged to produce a variable voltage on the output.

The first resistor is connected to the first input line and further to the emitter of the first transistor, and the second resistor is connected to the first input line and further to the emitter of the second transistor. The third resistor is connected to the second input line and further to the emitter of the third transistor, and the fourth resistor is connected to the second input line and further to the emitter of the fourth transistor. The collector of the first and fourth transistor is connected to the second output line and the collector of the second and third transistor is connected to the first output line.

The switch further comprises four constant current sources where the first, second, third and fourth constant current source are connected to the bases of the first, second, third and fourth transistor, respectively so that the transistors are saturated. The switch further comprises four alternating current sources where the first, second, third and fourth alternating current source are connected to the emitters of said first, second, third and fourth transistor, respectively, so that the transistors alternately are conducting current from emitter to collector and from collector to emitter.

By the arrangement above a switch is achieved using bi-polar PNP-transistors in a high-voltage process having suitable characteristics.

According to a preferred embodiment of the first aspect of the invention the switch comprises controller means for alternating apply a first working mode and a second working mode to achieve a chopper function.

In the first working mode, the controller means controls the second and fourth alternating current source to apply a current to the emitters of said second and fourth transistor, respectively, so that the second and fourth transistor work inversely and are current loads to the first and third transistor and the first and third alternating current sources are controlled to not apply a current to the emitters of the first and third transistors.

In the second working mode, the controller means controls the first and third alternating current source to apply a current to the emitters of the first and third transistor, respectively, so that the first and third transistor work inversely and are current loads to the second and fourth transistor and the second and fourth alternating current source are controlled to not apply a current to the emitters of the second and fourth transistors.

According to a preferred embodiment of the first aspect of the invention the switch is an integrated circuit and the first, second, third and fourth transistor are lateral PNP-transistors having a sinker guard ring going down to the underlying buried-layer.

Thereby a low saturation voltage, small leakage currents and reduced influence from parasitic components are achieved.

The above objects, among others are, according to a second aspect of the present invention, attained by a chopper stabilised amplifier for amplifying a voltage comprising an input for receiving an input voltage to be amplified and an output for outputting the amplified voltage, the amplifier further comprises an input switch coupled to said input, a AC-amplifier, and an output switch coupled to the output and an oscillator coupled to the input switch and the output switch.

The input switch in the chopper-stabilised amplifier is a switch according to the first aspect of the present invention.

By the arrangement above a chopper-stabilised amplifier is achieved suitable for amplifying small voltages over small resistances using bi-polar PNP-transistors in a high-voltage process.

According to a preferred embodiment of the second aspect of the invention the output switch is a switch according to the first aspect of the present invention.

According to a preferred embodiment of the second aspect of the invention the chopper-stabilised amplifier comprises a low-pass filter connected between the output switch and the output of said amplifier.

Thereby transients from the chopper-stabilised amplifier may be filtered out.

The above objects, among others are, according to a third aspect of the present invention, attained by a comparator for comparing a voltage on an input, wherein the comparator comprises a chopper stabilised amplifier according to the second aspect of the present invention.

By the arrangement above a comparator for comparing a voltage is achieved suitable for comparing voltages and which is using bi-polar PNP-transistors in a high-voltage process.

According to a preferred embodiment of the third aspect of the invention the comparator comprises means for generating a reference voltage, and means for comparing the voltage on the input to the comparator with the reference voltage.

Thereby the voltage on the input may be compared to a reference voltage and the amplifier in the comparator is utilised to amplify the difference between the voltage on the input and the reference voltage. Thus, the amplifier is made to work close to a zero voltage level and any voltage differences between the reference voltage and the voltage on the input is easily detectable.

According to a preferred embodiment of the third aspect of the invention the comparator comprises means for adding a current to the third and fourth constant current sources to achieve an extra voltage drop over the third and fourth resistor to construe the reference voltage, whereby said chopper stabilised amplifier amplifies the voltage difference between the reference voltage and the voltage on the input to the comparator.

The above objects, among others are, according to a fourth aspect of the present invention, attained by a method for tuning the working point of a power transistor having a drain connection and a gate connection. The method comprises the steps of comparing a voltage over a resistor, where the resistor has a known resistance and being serially connected to the drain connection. A comparator according to the third aspect of the present invention performs the comparison. Further more the voltage on the gate connection is changed, possibly through a number of step changes, to a first voltage value, for which first voltage value the comparator indicates that the voltage over the resistor is equal to the reference voltage, and using the first voltage value as the gate voltage during operation of the so tuned power transistor.

By varying the gate voltage while comparing the voltage over a resistor, serially connected to the drain of the power transistor, with a reference voltage, the working point of the power amplifier can be tuned. The reference voltage is selected, with knowledge of the resistors resistance, to be equal to the voltage over the resistor for a specific current through the resistor. This specific current is the drain current for the selected working point. When the gate voltage has been changed so that the comparator indicates no difference between the reference voltage and the voltage over the resistor, this gate voltage is the gate voltage to be used during operation for the selected working point for the power transistor.

Further characteristics of the invention and advantages thereof will be evident from the following detailed description of embodiments of the invention.

BRIEF DESCRIPTION OF THE DRAWINGS

The present invention will become better understood from the detailed description of embodiments of the present invention given herein below and the accompanying FIGS. 1–6, which are given by way of illustration only, and are thus not limitative of the present invention.

FIG. 3 is a schematic circuit diagram of a switch stage in the chopper-stabilised amplifier in FIG. 1 according to a preferred embodiment of the invention.

FIG. 6 is a schematic circuit diagram of a switch stage comprising a reference voltage according to a preferred embodiment of the invention.

DESCRIPTION OF PREFERRED EMBODIMENTS

In the following description, for purposes of explanation and not limitation, specific details are set forth, such as particular techniques and applications in order to provide a thorough understanding of the present invention. However, it will be apparent to one skilled in the art that the present invention may be practiced in other embodiments that depart from these specific details. In other instances, detailed descriptions of well-known methods and apparatuses are omitted so as not to obscure the description of the present invention with unnecessary details.

Figure 1:
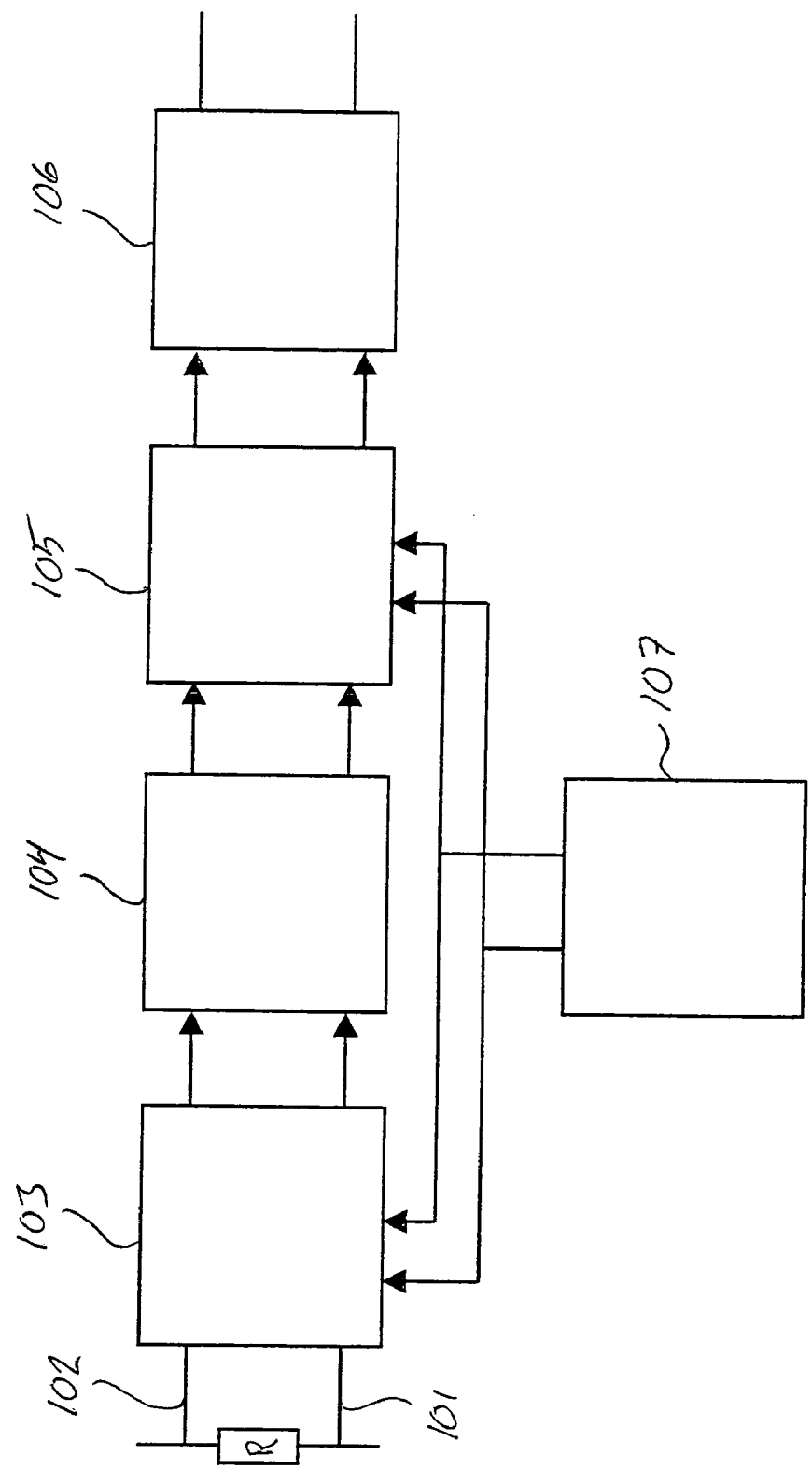
FIG. 1 is a schematic block diagram of a chopper-stabilised amplifier according to a preferred embodiment of the invention.

A schematic block diagram of a chopper-stabilised amplifier is shown in FIG. 1. An input to an input switch stage 103 has a first input line 101 and a second input line 102 and is connected over a resistor R for measuring the voltage over the resistor R. The input switch stage 103 will be further described below. The input switch stage is further connected to an AC-amplifier 104 for amplification of the signal. From the AC-amplifier the signal is again switched in an output switch stage 105. The output switch stage 105 may be of the same design as the input switch stage 103, but it can also be made simpler due to the larger signal levels of the amplified signal. Finally a low-pass RC-filter 106 filters out transients from the signal. An oscillator 107 is connected to the input switch stage 103 and output switch stage 105 and defines the operating frequency. Since the same oscillator 107 is used for the input switch stage 103 and the output switch stage 105, the stages 103 and 105 works synchronously.

The chopper-stabilised amplifier in FIG. 1 works with the differential voltage, or the voltage drop $V_1$, over the resistance R. This voltage drop $V_1$ is connected to the input switch 103 which alternating switch polarity of the differential voltage so that an alternating voltage $V_1$ having amplitudes of $V_1$ and $-V_1$ is fed to the AC-amplifier 104. Thus, the alternating voltage fed to the AC-amplifier ideally has a zero mean value. The AC-amplifier 104 amplifies the alternating voltage $V_1$ to $K*V_1$. The amplified alternating voltage $K*V_1$ is fed to the output switch stage 105, which is synchronised with the input switch 103, and an amplified voltage $K*V_1$ is produced at the output of the output switch stage 105. This signal may have transients so a low-pass RC-filter filters out any high frequency components to produce an amplified constant voltage $V_2=K*V_1$.

Figure 2:
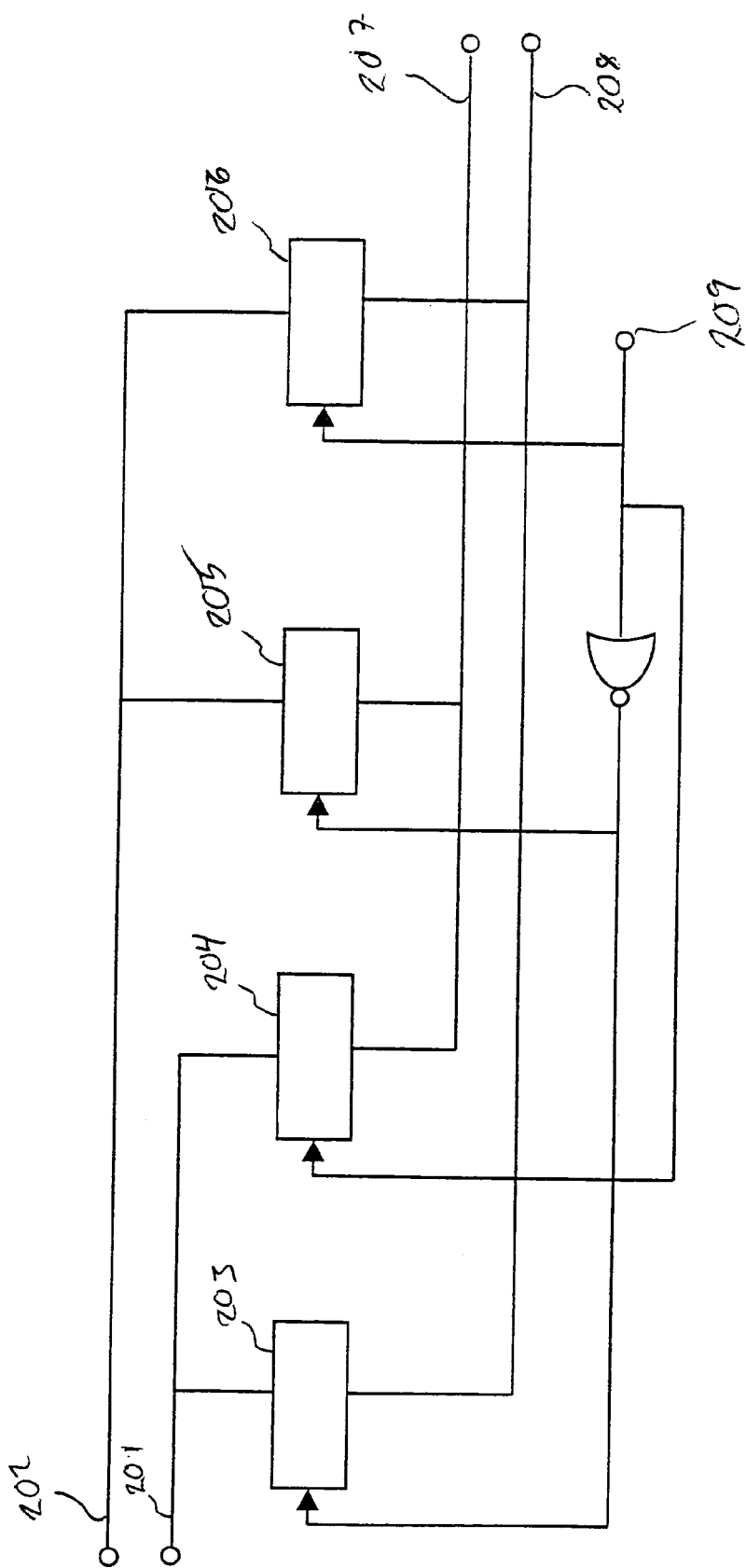
FIG. 2 is a schematic block diagram of a switch stage in the chopper-stabilised amplifier in FIG. 1 according to a preferred embodiment of the invention.

A schematic block diagram of the input switch in FIG. 1 is shown in FIG. 2. An input having a first input line 201 and a second input line 202 are connected over the resistor R as shown in FIG. 1. The input line 201 is connected to a first switch element 203 and a second switch element 204 and the second input line is connected to a third switch element 205 and a fourth switch element 206. The first switch element 203 and the fourth switch element 206 are further connected to an output line 207 and the second switch element 204 and the third switch element 205 is further connected to a second output line 208. A control input 209 is connected to the second 204 and fourth 206 switch element and through an inverter 210 to the first 203 and third 205 switch element. The control input 209 is arranged to switch on respective off the four switch elements. Since the inverter 210 is positioned between the control input 209 the first and third switch element, the first and fourth switch elements will be off when the second and fourth switch elements are on and vice verse.

If then a oscillator is present on the control input 209 the voltage present on the input will be chopped into alternating positive and negative voltage on the output, thus creating an alternating voltage with frequency determined by the frequency present on the control input 209. The output, comprising the first and second output lines 207 and 208 will be connected to the AC-amplifier 104 as shown in FIG. 1 for amplification of the alternating voltage.

FIG. 3 shows a circuit diagram according to a preferred embodiment of the invention implementing the input switch 103 in FIG. 1 including control circuits.

An input comprising a first input line 301 and a second input line 302 is connected over the low-resistance resistor R in FIG. 1, for which the voltage drop should be measured. An output comprising a first output line 303 and a second output line 304 are connected to the amplifier 204. First, second, third and fourth lateral PNP-transistors with sinker gard rings are denoted $T_1$, $T_2$, $T_3$ and $T_4$, respectively, are operating as switch elements. The rest of the components in the circuit diagram are control components.

The voltage $V_1$ is the negative feeding voltage. The first and second input lines 301 and 302 are also the positive feeding voltage. This works since the circuit is working with so low current, that the voltage drop caused by this current in the external resistor R, which has a very low resistance, is possible to neglect. At the same time, this voltage is the highest needed for control of the four switch transistors.

The voltage $V_2$ is a bias voltage for transistors $T_{15}$ and $T_{16}$, which makes them operate as current generators. The transistor $T_{15}$ generates a very low current due to an emitter resistance $R_5$. The current from the transistor $T_{15}$ is divided into four equal currents by transistors $T_5$, $T_7$, $T_9$ and $T_{11}$. The four currents from the respective collectors of the transistors $T_5$, $T_7$, $T_9$ and $T_{11}$ is connected to the bases of the first, second, third and fourth switch transistors $T_1$, $T_2$, $T_3$ and $T_4$. They will therefore be voltage saturated with a voltage drop over the emitter to the collector, which is in the order of 100 mV or even lower.

The current from the transistor $T_{16}$ passes through either transistor $T_{13}$ or transistor $T_{14}$ depending on the signal on the signal input 305 which is connected to the oscillator 107 as shown in FIG. 1.

The current from the collector of the transistor $T_{13}$ is divided into two equal currents by the transistors $T_6$ and $T_{10}$ and pulls down the emitter on the first and third switch transistor $T_{1\ and\ T3}$. Similarly, the current from the transistor $T_{14}$ is divided by transistors $T_8$ and $T_{12}$ and pulls down the emitter on the second and fourth switch transistor $T_2$ and $T_4$. The voltage $V_3$ is selected so that all control transistors, that is the transistors $T_5$ to $T_{16}$ operates linearly. Resistors $R_1$, $R_2$, $R_3$ and $R_4$ make it possible to pull down the emitters on the switch transistors.

The pull down of the emitters need not to be large, already 100 mV or less is enough to make the switch transistors operate inversely, i.e. that the emitter operates as collector and the collector operates as emitter. The switch transistor may then be regarded as switched off. However, some small current will go backwards through the switch transistor. This current will be a small current load on the output. This current load will be put on the transistor that is not switched off, so that it receives a working current so that it may operate quickly enough. The current is small and generates a small voltage drop, so the requirements on matching need not to be so great for the circuit to have a total error in the order of parts of a millivolt.

The circuit thus operates by alternately put the switch transistors $T_1$ and $T_3$ on, while the switch transistors $T_2$ and $T_4$ operates as current loads, and alternately put the switch transistors $T_2$ and $T_4$ on, while the switch transistors $T_1$ and $T_3$ operates as current loads. This circuit thereby overcomes the problems with using PNP-transistors. By controlling the transistors only with currents and that the positive feeding is performed via the input signal, all DC-control problems disappear. By controlling the transistors on the emitter connection and letting the bas current be constant all AC-control issues disappear. Since the switch transistors $T_2$ to $T_4$ is not switched on, respectively switched off, but instead constantly conducting, either in reverse mode or in normal mode, no AC-issues regarding for instance transients occur.

Thus, the switching is performed by lateral sinker gard ring PNP-transistors, which are on all the time. The switching is done by alternately putting the transistors in normal mode or inverse mode.

Figure 4B:
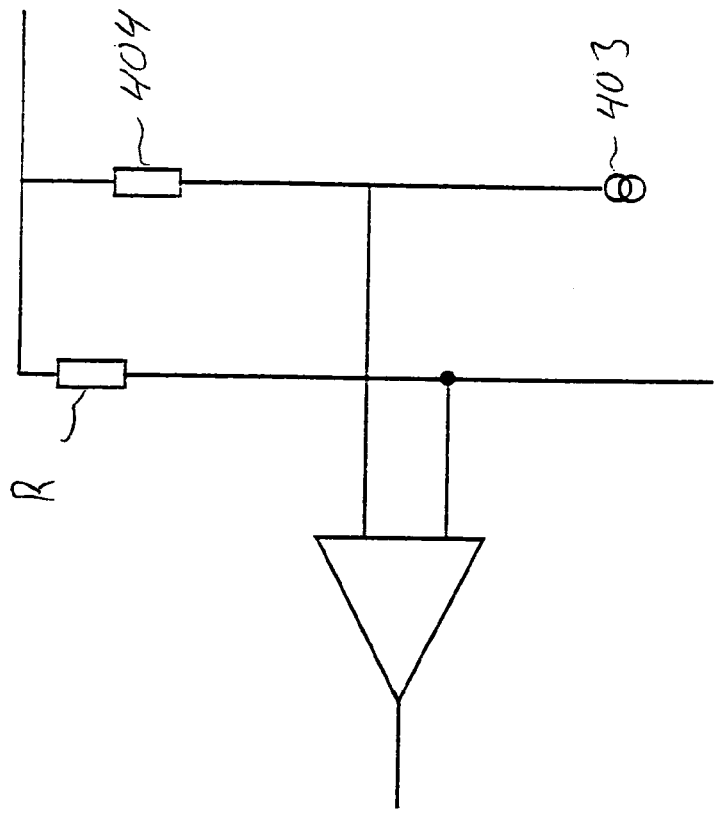
FIGS. 4a and 4b are schematic block diagrams of an implementation of a reference voltage in a chopper-stabilised amplifier to achieve a comparator according to a preferred embodiment of the invention.
Figure 4A:
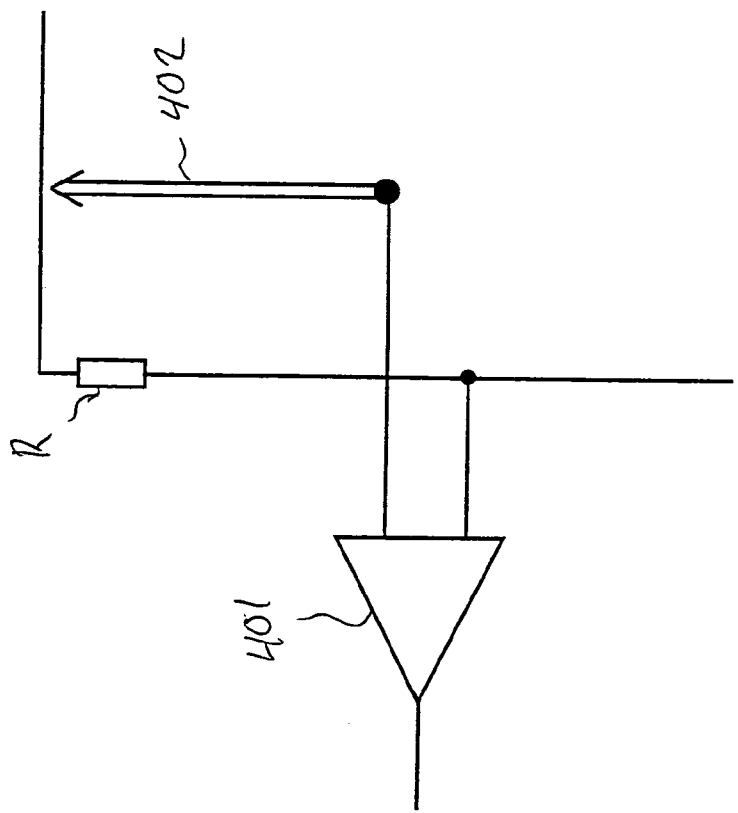

With reference to FIGS. 4a and 4b, a comparator 401 should have a reference voltage 402 to compare the measured voltage over the resistance R with, for performing the actual measurement and to thereby achieve the best possible accuracy. The comparator 401 is then arranged to work with zero voltage difference and a read-out from the comparator 401 will very precisely indicate if the measured voltage is equal to the reference voltage or if it differs. The reference voltage 402 is thus changed to precisely measure the voltage over the resistance R. Alternatively where a current through a known resistance is to be measured, as is the case in the application of setting a base voltage for a preferred drain current in a power transistor, the current through the resistor may be altered, by changing the base voltage on the power transistor, until the voltage over the resistor R equals the reference voltage.

A practical way of implementing this is to generate a current 403 through a reference resistor 404 to generate the reference voltage. This may readily be implemented in the circuit diagram in FIG. 3.

Figure 5:
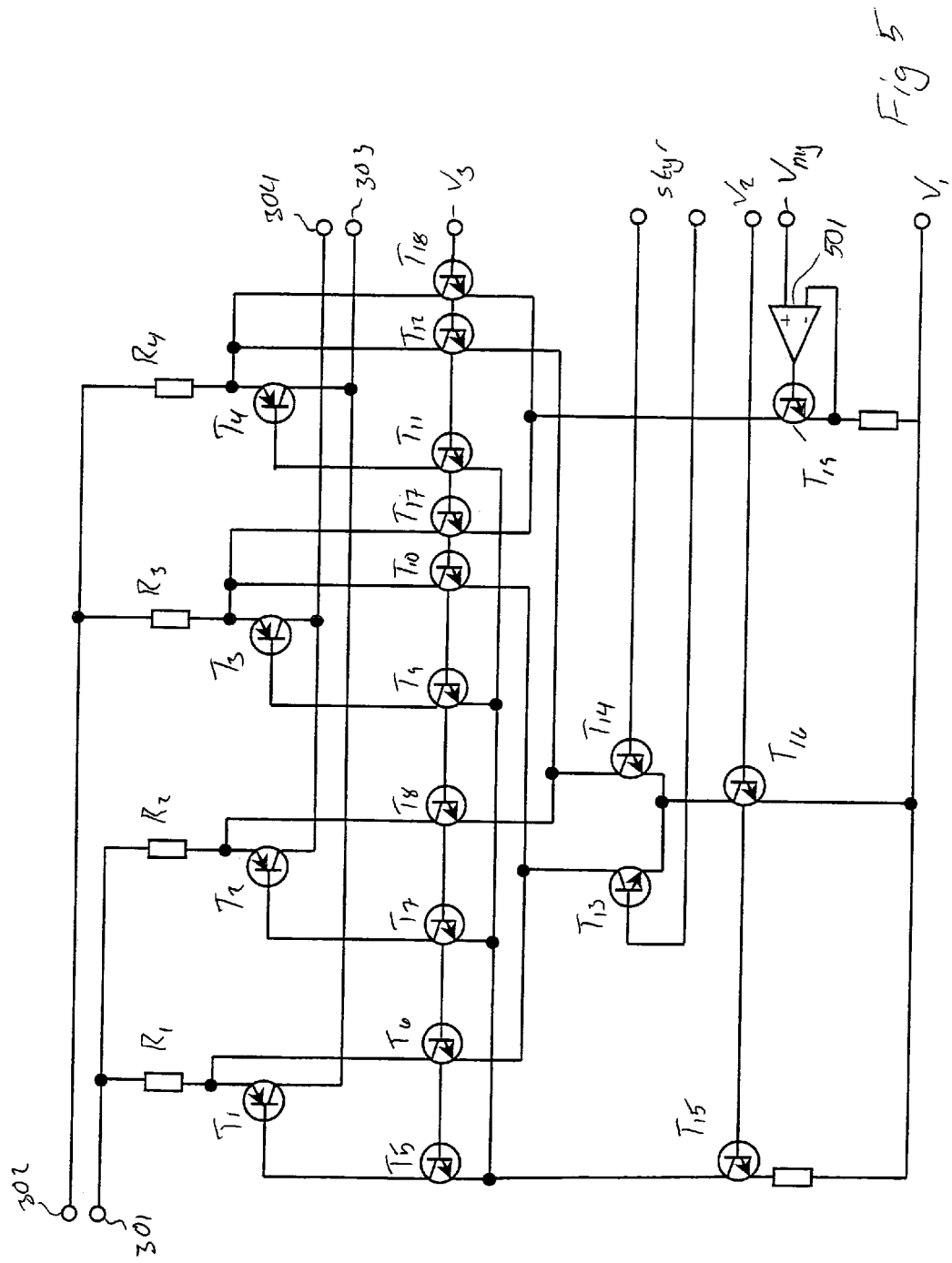
FIG. 5 is a schematic circuit diagram of a switch stage comprising a reference voltage according to a preferred embodiment of the invention.

With reference to FIG. 5, same features have been denoted with the same reference numerals as in FIG. 3. The basic working of the chopper function in the embodiment in FIG. 5 is the same as for the embodiment described in connection with FIG. 3. The added functionality regards the implementation of the reference voltage as will be described.

To create the reference voltage a transistor $T_{17}$ and a transistor $T_{18}$ have been added. The transistors $T_{17}$ and $T_{18}$ are feeding a current into the resistors $R_3$ and $R_4$, respectively, which thus is used as reference resistors. A transistor $T_{19}$ fed by an operation amplifier 501 generates the current to the transistors $T_{18}$ and $T_{19}$. The collector capacitors in the transistors $T_{17}$ and $T_{18}$ requires that an matching circuit may have to be added to the transistors $T_1$ and $T_2$ to achieve optimal matching at a high enough frequency.

An alternative way of achieving the reference voltage is to add currents to the emitters on the transistors $T_{10}$ and $T_{12}$ as is shown in FIG. 6. To be able to feed currents only to $T_{10}$ and $T_{12}$, the transistor $T_{13}$ has been divided into two transistors $T_{20}$ and $T_{21}$ and $T_{14}$ has been divided into transistors $T_{22}$ and $T_{23}$. Transistors $T_{24}$ and $T_{25}$ is feeding current to the respective emitter of $T_{10}$ and $T_{12}$, and is in turn fed by the operation amplifier 601.

It will be obvious that the invention may be varied in a plurality of ways. For instance, the NPN-transistors may be exchanged for Darlington-transistors so that the circuit may be less dependent of bas currents. Such variations are not to be regarded as a departure from the scope of the invention. All such modifications as would be obvious to one skilled in the art are intended to be included within the scope of the appended claims.

What is claimed is:

1. A switch comprising an input with a first and a second input line and an input stage comprising first, second, third and fourth current controlled PNP-transistors and first, second, third and fourth resistors, and an output comprising a first and a second output line, and wherein said switch is arranged to receive a constant voltage on said input and produce a variable voltage on said output, wherein said first resistor is connected to said first input line and further to the emitter of said first transistor, said second resistor is connected to said first input line and further to the emitter of said second transistor, said third resistor is connected to said second input line and further to the emitter of said third transistor, said fourth resistor is connected to said second input line and further to the emitter of said fourth transistor, the collector of said first and fourth transistor is connected to said second output line, the collector of said second and third transistor is connected to said first output line, and first, second, third and fourth constant current sources are connected to the bases of said first, second, third and fourth transistor, respectively so that said transistors are conductive, and first, second, third and fourth alternating current sources are connected to the emitters of said first, second, third and fourth transistor, respectively, so that the transistors alternately are conducting current from emitter to collector and from collector to emitter.

2. The switch according to claim 1, wherein said switch comprises controller means, said controller is provided to, in a first working mode, controlling said fourth and eighth current sources to apply a current to the emitters of said second and fourth transistor, respectively, so that said second and fourth transistor work inversely and are current loads to said first and third transistor and said second and sixth current sources are controlled to not apply a current to the emitters of said first and third transistors, said controller means is provided to, in a second working mode, controlling said second and sixth current sources to apply a current to the emitters of said first and third transistor, respectively, so that said first and third transistor work inversely and are current loads to said second and fourth transistor and said fourth and eighth current sources are controlled to not apply a current to the emitters of said second and fourth transistors, and said controller means is provided to alternately apply said first and second working mode to achieve a chopper function.

3. The switch according to claim 1, wherein, an input signal on said input is provided to be used as positive feeding voltage.

4. The switch according to claim 1, wherein said switch is an integrated circuit and said first, second, third and fourth transistor are lateral PNP-transistors having a sinker guard ring going down to the underlying buried layer.

5. A chopper stabilised amplifier for amplifying a voltage comprising an input for receiving an input voltage to be amplified and an output for outputting said amplified voltage, said amplifier further comprises an input switch coupled to said input, a AC-amplifier, and an output switch coupled to said output and an oscillator coupled to said input switch and said output switch, wherein said input switch is a first switch comprising an input with a first and a second input line and an input stage comprising first, second, third and fourth current controlled PNP-transistors and first, second, third and fourth resistors, and an output comprising a first and a second output line, and wherein said first switch is arranged to receive a constant voltage on said input and produce a variable voltage on said output, wherein said first resistor is connected to said first input line and further to the emitter of said first transistor, said second resistor is connected to said first input line and further to the emitter of said second transistor, said third resistor is connected to said second input line and further to the emitter of said third transistor, said fourth resistor is connected to said second input line and further to the emitter of said fourth transistor, the collector of said first and fourth transistor is connected to said second output line, the collector of said second and third transistor is connected to said first output line, and first, second, third and fourth constant current sources are connected to the bases of said first, second, third and fourth transistor, respectively so that said transistors are conductive, and first, second, third and fourth alternating current sources are connected to the emitters of said first, second, third and fourth transistor, respectively, so that the transistors alternately are conducting current from emitter to collector and from collector to emitter.

6. The chopper stabilised amplifier according to claim 5, wherein said output switch is a second switch comprising an input with a third and a fourth input line and an input stage comprising fifth, sixth, seventh and eighth current controlled PNP-transistors and fifth, sixth, seventh and eighth resistors, and an output comprising a third and a fourth output line, and wherein said second switch is arranged to receive a constant voltage on said input and produce a variable voltage on said output, wherein said fifth resistor is connected to said third input line and further to the emitter of said fifth transistor, said sixth resistor is connected to said third input line and further to the emitter of said sixth transistor, said seventh resistor is connected to said fourth input line and further to the emitter of said seventh transistor, said eighth resistor is connected to said fourth input line and further to the emitter of said eighth transistor, the collector of said fifth and eighth transistor is connected to said fourth output line, the collector of said sixth and seventh transistor is connected to said third output line, and fifth, sixth, seventh and eighth constant current sources are connected to the bases of said fifth, sixth, seventh and eighth transistor, respectively so that said transistors are conductive, and fifth, sixth, seventh and eighth alternating current sources are connected to the emitters of said fifth, sixth, seventh and eighth transistor, respectively, so that the transistors alternately are conducting current from emitter to collector and from collector to emitter.

7. The chopper stabilised amplifier according to claim 5, wherein a low-pass filter is connected between the output switch and the output of said amplifier.

8. The chopper stabilised amplifier according to claim 6, wherein a low-pass filter is connected between the output switch and the output of said amplifier.

9. A comparator for comparing a voltage on an input, wherein said comparator comprises a chopper stabilised amplifier according to claim 5.

10. The comparator according to claim 9, comprising means provided to generate a reference voltage, and means provided to compare said voltage on said input to said comparator with said reference voltage.

11. The comparator according to claim 10, comprising means provided to add a current to said third and fourth current sources to achieve an extra voltage drop over said third and fourth resistor to construe a reference voltage, whereby said chopper stabilised amplifier amplifies the voltage difference between said reference voltage and the voltage on said input to said comparator.

12. A method for tuning the working point of a MOS power transistor having a drain connection and a gate connection, comprising the steps of:

comparing a voltage over a resistor, having a known resistance and being serially connected to said drain connection, by a comparator according to claim 9, changing the voltage on said gate connection to a first voltage value, for which first voltage value said comparator indicates that the voltage over said resistor is equal to said reference voltage, and using said first voltage value as the gate voltage during operation of the so tuned MOS power transistor.

13. A method for tuning the working point of a bipolar power transistor having a collector connection and a base connection, comprising the steps of:

comparing a voltage over a resistor, having a known resistance and being serially connected to said collector connection, by a comparator according to claim 9, changing the voltage on said base connection to a first voltage value, for which first voltage value said comparator indicates that the voltage over said resistor is equal to said reference voltage, using said first voltage value as the base voltage during operation of the so tuned bipolar power transistor.

* * * * *